(12) United States Patent
Carey et al.

(10) Patent No.: US 9,007,096 B1
(45) Date of Patent: Apr. 14, 2015

(54) HIGH-SPEED ANALOG COMPARATOR

(71) Applicant: Xilinx, Inc., San Jose, CA (US)

(72) Inventors: Declan Carey, Douglas (IE); Thomas Mallard, Popes Quay (IE); Mark Smyth, Midleton (IE); James Hudner, Charleville (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/324,858

(22) Filed: Jul. 7, 2014

(51) Int. Cl.
*H03K 5/22* (2006.01)
*G01R 17/02* (2006.01)

(52) U.S. Cl.
CPC ............................ *G01R 17/02* (2013.01)

(58) Field of Classification Search
USPC ............................................ 327/65; 330/252
See application file for complete search history.

(56) References Cited

U.S. PATENT DOCUMENTS

| | | | | |
|---|---|---|---|---|
| 4,585,961 A * | 4/1986 | Daubert | | 327/349 |
| 5,907,259 A * | 5/1999 | Yamada et al. | | 327/563 |
| 5,973,515 A * | 10/1999 | Marbot et al. | | 327/65 |
| 6,566,952 B1 * | 5/2003 | Allan | | 330/255 |
| 6,703,871 B2 * | 3/2004 | You et al. | | 327/52 |
| 7,199,620 B2 * | 4/2007 | Ishizuka et al. | | 327/65 |
| 7,250,819 B2 * | 7/2007 | Kelly et al. | | 330/257 |
| 7,639,553 B2 * | 12/2009 | Kim | | 365/194 |
| 8,624,632 B2 * | 1/2014 | Bulzacchelli | | 327/57 |
| 8,829,943 B2 * | 9/2014 | Kumar | | 327/77 |
| 2005/0012526 A1 * | 1/2005 | Brekelmans et al. | | 327/65 |
| 2006/0132192 A1 * | 6/2006 | Yu | | 327/65 |
| 2010/0039305 A1 * | 2/2010 | Yoshioka | | 341/155 |
| 2014/0086364 A1 * | 3/2014 | Schell et al. | | 375/340 |
| 2014/0117956 A1 * | 5/2014 | Price et al. | | 323/274 |

* cited by examiner

*Primary Examiner* — Ryan Jager
(74) *Attorney, Agent, or Firm* — W. Eric Webostad

(57) ABSTRACT

An apparatus relating generally to voltage conversion includes an amplifier coupled to receive an input voltage and a reference voltage. First and second converters are coupled to the amplifier to receive a bias voltage. The first converter includes a first transconductor coupled to receive the bias voltage to adjust a first tail current, and a first differential input. A first inverter of the first converter has a first feedback device coupled input-to-output to provide a first transimpedance amplifier load. The first inverter is coupled to the first transconductor. The second converter includes a second transconductor coupled to receive the bias voltage to adjust a second tail current, and a second differential input. A second inverter of the second converter has a second feedback device coupled input-to-output to provide a second transimpedance amplifier load. The second inverter is coupled to the second transconductor.

20 Claims, 5 Drawing Sheets

HIGH-SPEED ANALOG COMPARATOR

TECHNICAL FIELD

The following description relates to integrated circuit devices ("ICs"). More particularly, the following description relates to a high-speed analog comparator for an IC.

BACKGROUND

Analog signaling is becoming more relevant with higher frequency applications, in particular high-speed signal processing applications. In some analog applications, a conventional asynchronous analog comparator may be used. However, conventional analog comparators may be too slow for some high-speed analog applications due to slewing latency. Furthermore, some conventional asynchronous analog comparators may have high impedance nodes limiting bandwidth of a circuit. Hence, it is desirable and useful to provide an analog comparator that overcomes one or more of the above-described limitations associated with conventional analog comparators.

SUMMARY

An apparatus relates generally to voltage conversion. In such an apparatus, an amplifier is coupled to receive an input voltage and a reference voltage to provide a bias voltage. A first converter and a second converter are coupled to the amplifier to receive the bias voltage. The first converter includes a first transconductor and a first inverter. The first transconductor is coupled to the amplifier to receive the bias voltage to adjust a first bias current, and to receive a first differential input. The first inverter has a first feedback device coupled input-to-output of the first inverter to provide a first transimpedance amplifier load. The first inverter is coupled to the first transconductor. The second converter includes a second transconductor and a second inverter. The second transconductor is coupled to the amplifier to receive the bias voltage to adjust a second bias current and to receive a second differential input. The second differential input is the first differential input with a reversed polarity. The second inverter has a second feedback device coupled input-to-output of the second inverter to provide a second transimpedance amplifier load. The second inverter is coupled to the second transconductor.

An asynchronous analog comparator relates generally to voltage conversion. In such an asynchronous analog comparator, an amplifier is coupled to receive an input voltage and a reference voltage to provide a bias voltage. A first converter and a second converter are commonly coupled to an output port of the amplifier to receive the bias voltage. The first converter includes a first transconductor and a first inverter. The first transconductor includes: a first current source circuit coupled to receive the bias voltage; a first differential input circuit coupled to the first current source circuit; and a first current mirror circuit coupled to the first differential input circuit. The first differential input circuit of the first transconductor has a first output node. The first inverter has a first feedback device coupled in first series input-to-output of the first inverter to provide a first transimpedance amplifier load. A first input node of the first inverter is coupled to the first output node of the first transconductor. The second converter includes a second transconductor and a second inverter. The second transconductor includes: a second current source circuit coupled to receive the bias voltage; a second differential input circuit coupled to the second current source circuit; and a second current mirror circuit coupled to the second differential input circuit. The second differential input circuit is the first differential input circuit with a reversed polarity differential input. The second differential input circuit of the second transconductor has a second output node. The second inverter has a second feedback device coupled in second series input-to-output of the second inverter to provide a second transimpedance amplifier load. A second input node of the second inverter is coupled to the second output node of the second transconductor.

A method relates generally to voltage conversion. In such a method, a difference between an input voltage and a reference voltage is amplified to provide a bias voltage. A first transconductor and a second transconductor are biased with the bias voltage. A first differential input is input to the first transconductor. A second differential input is input to the second transconductor. The first differential input is the second differential input with opposite polarity. A first current in relation to the first differential input is generated with the first transconductor for input of a portion of the first current to a first transimpedance amplifier load. A second current in relation to the second differential input is generated with a second transimpedance amplifier load for input to the second transconductor. A first output voltage is output from the first transimpedance amplifier load. A second output voltage is output from the second transimpedance amplifier load.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 1-2 is a schematic diagram depicting an exemplary comparator.

FIG. 1-3 is a schematic/block diagram depicting another exemplary comparator.

FIG. 2 is a flow diagram depicting an exemplary comparator flow.

FIG. 3 is a simplified block diagram depicting an exemplary columnar Field Programmable Gate Array ("FPGA") architecture.

DETAILED DESCRIPTION

Figure 1:
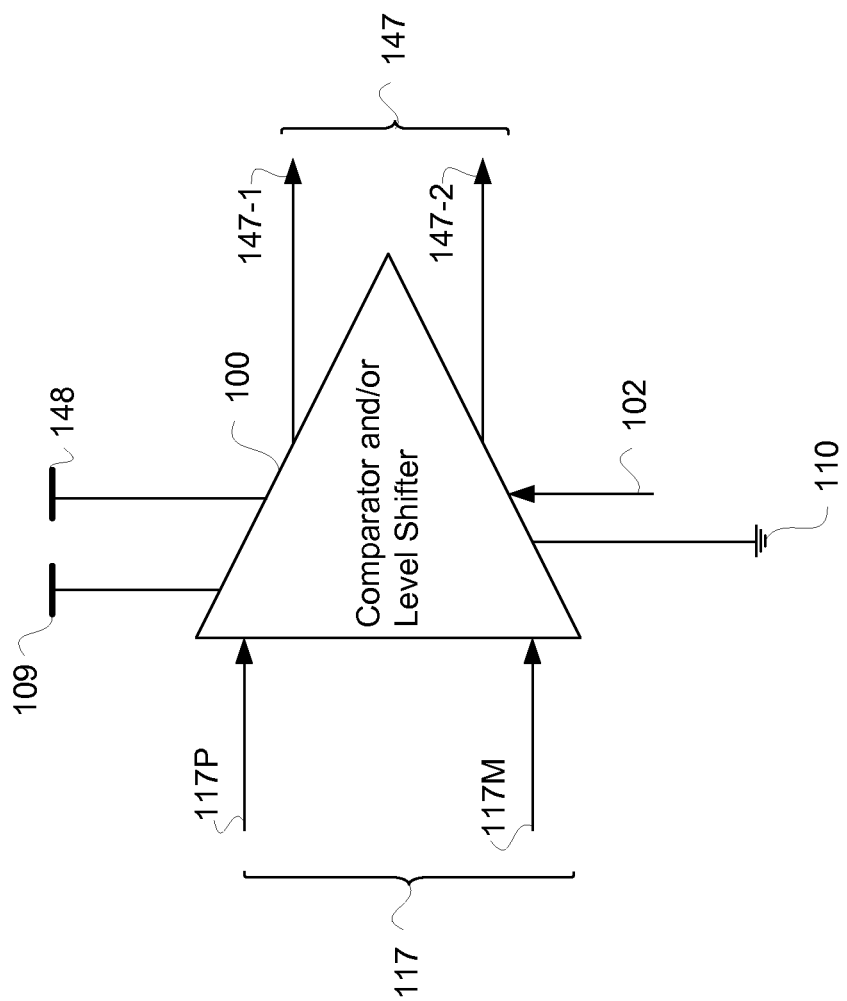
FIG. 1-1 is a block diagram depicting an exemplary asynchronous analog comparator and/or level shifter.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

Generally, analog comparators are either clocked or asynchronous. An asynchronous analog comparator is described below in additional detail. Such a comparator may be used in low latency or low delay asynchronous applications. The comparator includes two voltage-to-current-to-voltage converters, which are copies of one another though with polarities of a differential input reversed. Each voltage-to-current-to-voltage converter includes a transconductor with an adjustable tail current stage ("transconductor stage") followed by or cascaded with a transimpedance amplifier load stage ("transimpedance stage"). An output node of such a transconductor stage is coupled to such transimpedance stage. Biasing is provided to such converters to promote balancing such that transconductor and transimpedance stages may operate without introducing static offsets, which balancing may lead to an optimal bias or trip point of such a comparator. Each converter includes both a transconductor stage and a transimpedance stage such that at balance there may be little to no current flowing in a coupling node between these stages. If, however, static offsets exist in inputs to such stages, a bias condition may remain as though such static offsets were not present. Such transimpedance stage, which in effect is a trip-point biased inverter, may have a low impedance input, as a current feedback is used for coupling input and output of such transimpedance stage. A bias voltage or bias current may be used to balance converters to such trip point.

Along those lines, a circuit which may be used for high-speed signal processing is described. In an implementation, such circuit may be used as an asynchronous analog comparator. Such comparator may include two voltage-to-current-to-voltage converters or gain stages combined with a bias feedback loop with balancing and coupled to cancel static offsets. By combining two voltage-to-current-to-voltage converters with input terminal's polarity reversed with respect to one another and with a bias control loop, CMOS compatible output stages may be maintained, subject to any linearity limits, at an optimal bias or trip point whether or not a differential input signal is balanced. Thus, a circuit with a fast response time may be employed with low slewing latency for an asynchronous circuit.

With the above general understanding borne in mind, various configurations for an asynchronous analog comparator are generally described below.

FIG. 1-1 is a block diagram depicting an exemplary asynchronous analog comparator and/or level shifter 100. For purposes of clarity by way of example and not limitation asynchronous analog comparator and/or level shifter 100 is further described as a "comparator" 100.

Comparator 100 may be a differential analog comparator. Comparator 100 may be coupled to receive a differential input 117, which may include a plus-side or plus-rail input voltage 117P and a minus-side or minus rail input voltage 117M. Comparator 100 may be a balanced, low-delay comparator, as described below in additional detail. However, more generally, such comparator 100 may be used in a variety of analog signal processing applications, including without limitation high-speed wireless and wireline communications. Such comparator 100, or a circuit topology thereof, may be used for high-speed level shifting, to low duty-cycle distortion ("DCD") current mode logic ("CML") signal chains, and/or to low noise CML signal chains.

Along those lines, a circuit as described herein may be useful as a high-speed level shifter, as a differential input stage and a differential output state need not be at the same supply voltage level. As an interface between a transconductance input stage and a transimpedance output stage is current-mode, different supply rails may be used for these stages. A circuit as described herein may be useful as being compatible with low noise design because just two stages may be used to go efficiently from small signal CML to large swing CMOS. The number of stages can be low, resulting in fewer noise contributions. A circuit as described herein may be useful for low DCD CML chains because the balanced nature of a bias configuration means an output stage may be biased optimally near a trip point. Thus, a differential analog comparator 100 is described for purposes of clarity and not limitation.

Comparator 100 may be biased with supply voltage buses 109 and 148, which may be at the same or different voltage levels, as described below in additional detail. Comparator 100 may be coupled to ground 110 and may be coupled to receive a bias voltage 102 to adjust balance of comparator 100, as described below in additional detail. Comparator 100 may provide a differential output 147 having an output voltage 147-1 and an output voltage 147-2.

For high-speed signaling, input voltages 117P and 117M may have a small swing for a common mode voltage, namely well within a supply voltage level and a ground in this example. In this example, input voltages 117P and 117M may be along a linear region of operation of a differential input 117, an example of which is described below in additional detail. As described below in additional detail, for input voltages 117P and 117M provided to gates of NMOS transistors of respective differential inputs with polarities reversed with respect to one another, input voltages 117P and 117M may be in a range of approximately 50 to 90 percent of a supply voltage level used to bias such NMOS transistors, such as for example a range of approximately 0.50V to 0.90V for a Vdd of 1V. This application may be for small differences between input voltages 117P and 117M, which may be for high-speed applications where a "low-tau" for comparator 100 is useful. A "low-tau" generally means a low delay or latency. However, larger differences between input voltages 117P and 117M may be used, and so for example input voltages 117P and 117M for a CMOS implementation may be in a range of approximately ground to a CMOS supply voltage level. However, a low-tau for comparator 100 may be sacrificed if a full CMOS-level swing was implemented. Generally, comparator 100 may have a limited amount of headroom, and so comparator 100 may be used in high-speed applications where a common mode voltage for comparator 100 is in a range of approximately 50 to 90 percent of a supply voltage level for sufficient headroom.

Figures 1, 2:
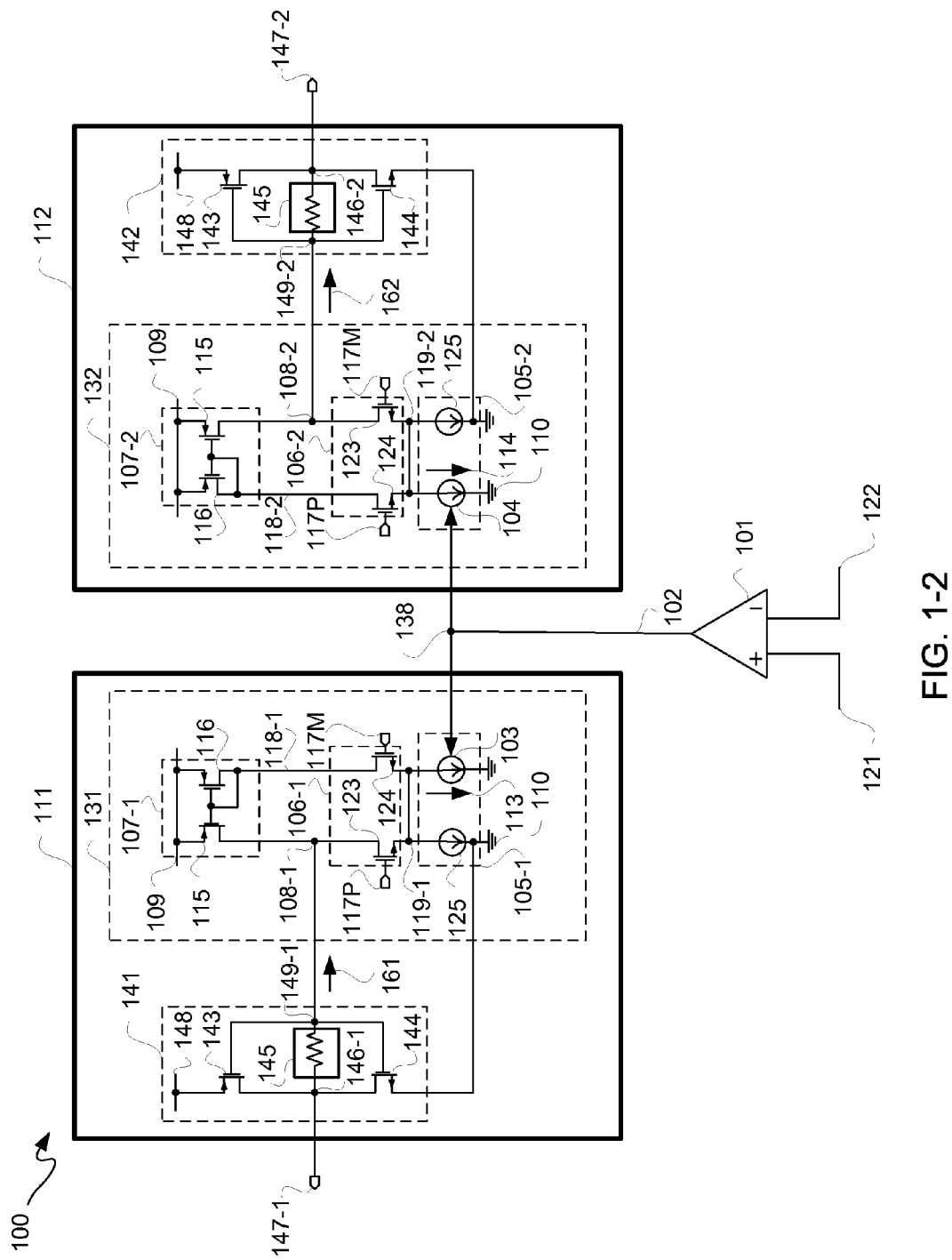

FIG. 1-2 is a schematic diagram depicting an exemplary comparator 100.

Figures 1, 2, 3:
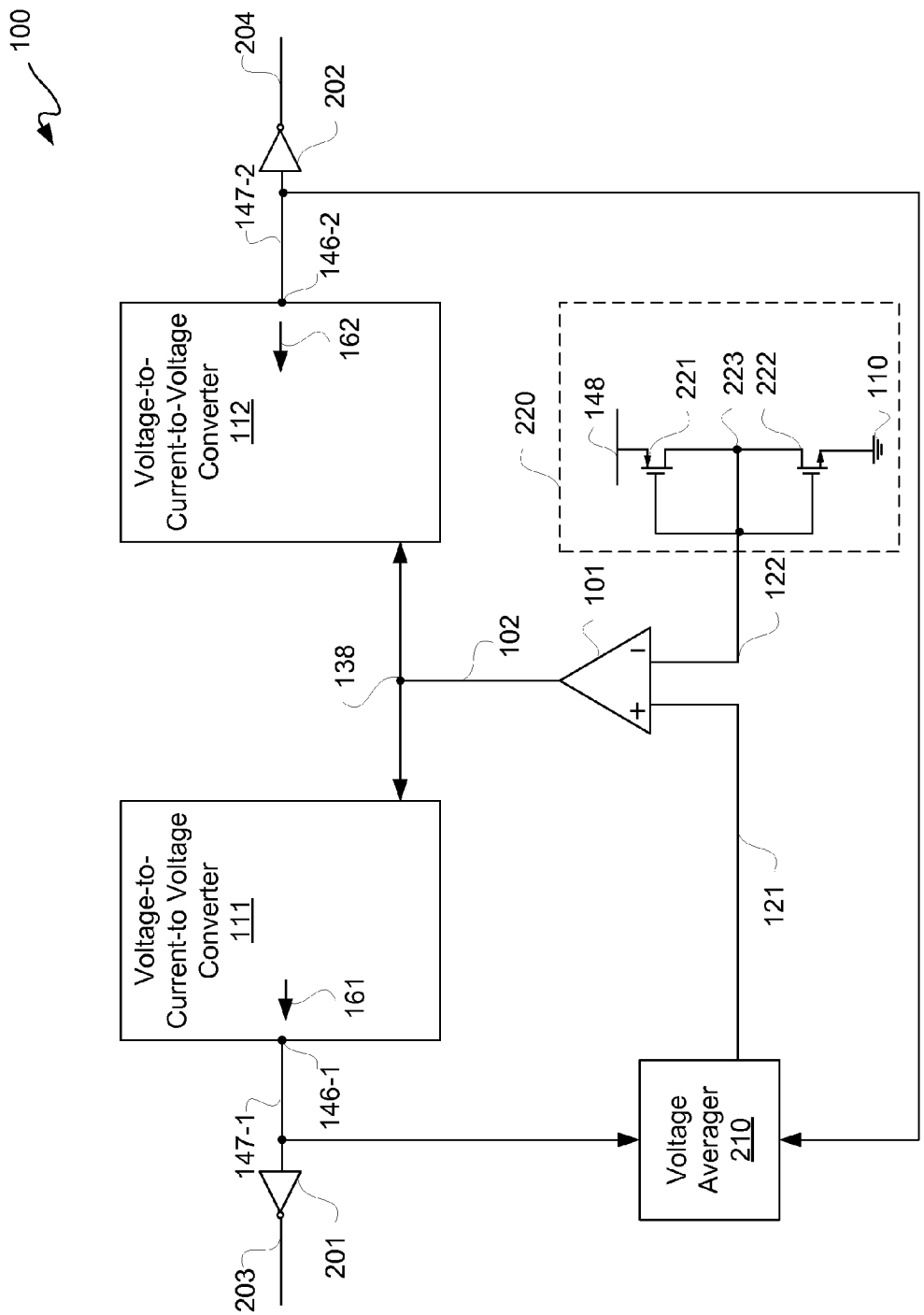
Figure 2:
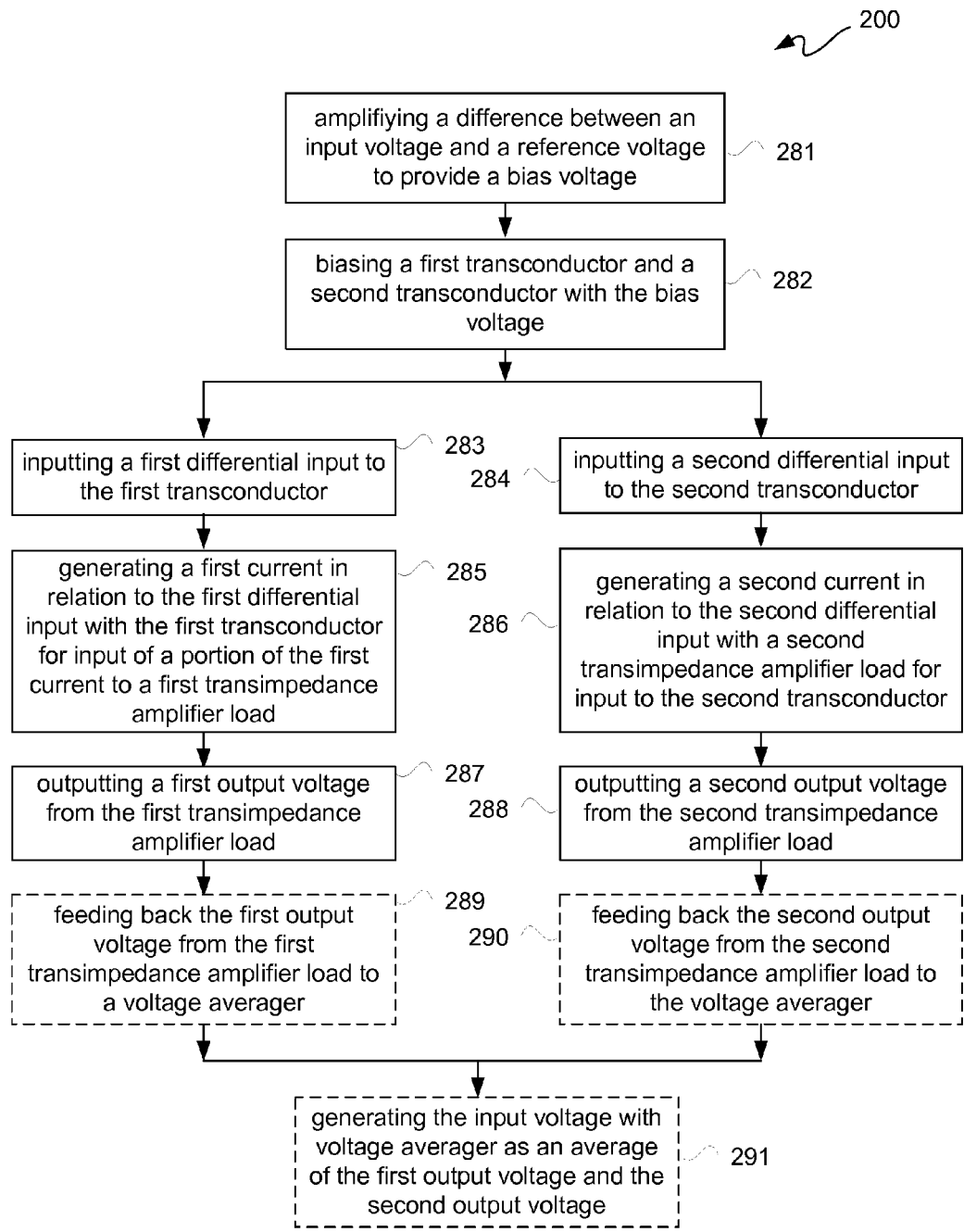
Figure 3:
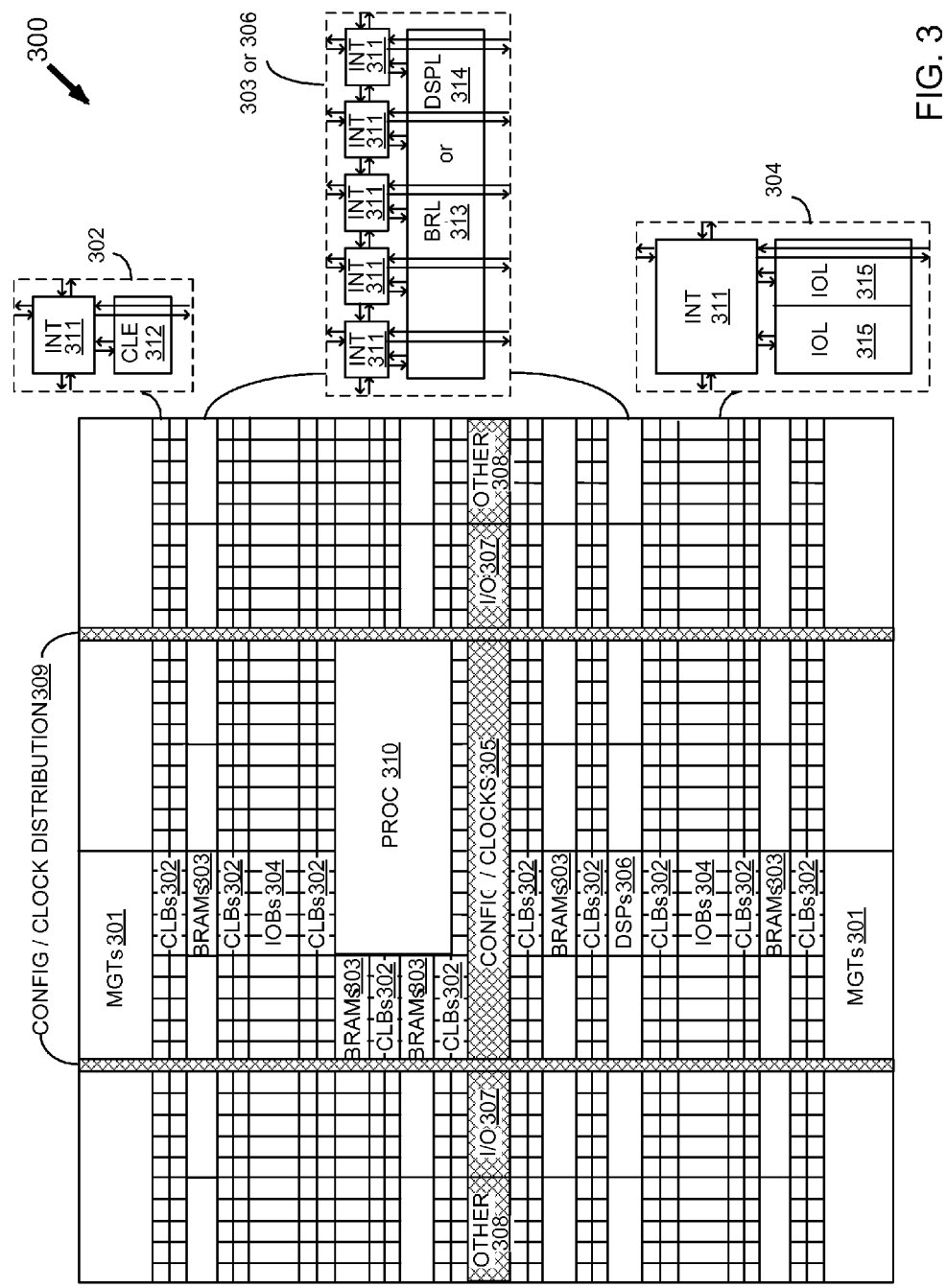

FIG. 2 is a flow diagram depicting an exemplary comparator flow 200, which may be used with comparator 100 of FIG. 1-2 or of FIG. 1-3. According, comparator 100 and comparator flow 200 are further described with simultaneous reference to FIGS. 1-2 and 2.

In this example, comparator 100 includes an amplifier 101. Amplifier 101 may be coupled to receive an input voltage 121 and a reference voltage 122. In this example, input voltage 121 is provided to a plus port of amplifier 101, and reference voltage 122 is provided to a minus port of amplifier 101. Comparator 100 further includes a voltage-to-current-to-voltage converter ("converter") 111 and a voltage-to-current-to-voltage converter ("converter") 112, and such converters 111 and 112 are commonly coupled at a common bias input node 138 to an output port of amplifier 101 to receive a bias voltage 102 from amplifier 101. As described below in additional detail converters 111 and 112 may generally be copies of one another though with differential inputs reversed. Thus, corresponding transistors in converters 111 and 112 may be matched to one another. In this configuration, amplifier 101 may be a conventional voltage gain amplifier used to provide an output voltage. However, in another configuration, adjustable current sources 103 and 104 may be incorporated into a transconductance amplifier 101 (e.g., voltage difference input-to-amplified current output responsive to such voltage difference input) to provide respective bias currents 113 and 114 rather than a bias voltage 102.

Bias voltage 102 may be provided to adjustable current sources 103 and 104 respectively of converters 111 and 112. In this example, bias voltage 102 is a positive voltage (i.e., not less than ground or zero volts). Along those lines, a CMOS amplifier 101 may be configured to provide at least a de minimis amount of bias voltage, generally approximately mid-rail, for bias voltage 102 to preserve gain of amplifier 101. However, a bias voltage 102 need not be small, even in a linear balanced condition. More generally, bias voltage 102 may depend on geometry/size of a current source 103 or a current source 104 being driven by a bias voltage 102, along with the amount of bias current 113 or 114 resulting from such current source 113. Even though different reference numbers are used for adjustable current sources 103 and 104, these current sources may have a same configuration and a same sizing of transistors in order to operate the same. A value of such bias voltage 102 may further depend on process variables, including without limitation transistor threshold voltage of transistors used to provide such current source 113. Along those lines, if an input voltage 121 equals a reference voltage 122, then output voltage 147-1, 147-2 may be close to Vdd/2 or some other appropriate common mode output voltage. Such bias voltage 102 may be used to operate n-type transistors of adjustable current sources 103 and 104 respectively of current source circuit 105-1 and current source circuit 105-2 for providing bias currents 113 and 114, respectively, for converters 111 and 112. These bias currents 113 and 114 may be considered respective tail currents, or more particularly portions of a total tail current.

In this example, bias voltage 102 is generated as between a positive supply voltage and ground; however, in another configuration (e.g., DMOS or bipolar) power biasing may be between positive and negative voltage levels. However, as described below in additional detail a CMOS configuration with positive voltages is described. Such a configuration allows for a single supply voltage level and a common ground to be used for all circuitry of a comparator 100 of FIG. 1-2, as well as that of comparator 100 of FIG. 1-3 as described below in additional detail.

At 281, amplifier 101 amplifies a difference between an input voltage 121 and a reference voltage 122 to provide a bias voltage 102. Once comparator 100 is at least close to being balanced and linear, then bias voltage 102 is going to be a small voltage. This small bias voltage 102 assists in having a low-tau for comparator 100, as generally there is less time involved with moving between small voltage differences as compared with large voltage differences.

Voltage-to-current-to-voltage converter 111 includes a transconductor 131 and an inverter 141. Voltage-to-current-to-voltage converter 112 includes a transconductor 132 and an inverter 142. Transconductor 131 includes a current source circuit 105-1, a differential input circuit 106-1, and a current mirror circuit 107-1. Transconductor 132 includes a current source circuit 105-2, a differential input circuit 106-2, and a current mirror circuit 107-2. At 282, a first transconductor 131 and a second transconductor 132 are both biased with a bias voltage 102 provided at 281. More particularly, adjustable current sources 103 and 104 respectively of current source circuit 105-1 and current source circuit 105-2 may both be biased with a bias voltage 102 provided at 281.

In this example, current mirror circuits 107-1 and 107-2 each include a pair of p-type transistors 115 and 116. Each transistor 116 of current mirror circuits 107-1 and 107-2 may have a source region coupled to a supply voltage bus 109. In this example, supply voltage bus 109 is at a Vdd voltage level; however, voltage levels other than Vdd may be used in other examples. Furthermore, each supply voltage bus 109 may be the same or different voltage buses though they are both at a same voltage level. Transistors 115 and 116 of each of current mirror circuits 107-1 and 107-2 are commonly gated. A drain region of transistor 116 of current mirror circuit 107-1 is coupled to a gate thereof as well as to an input-side node 118-1, and a drain region of transistor 116 of current mirror circuit 107-2 is coupled to a gate thereof as well as to an input-side node 118-.2.

In this example, differential input circuits 106-1 and 106-2 each include a pair of n-type transistors 123 and 124. Transistor 123 of differential input circuit 106-1 has a gate coupled to receive a plus or positive side or rail of an input voltage 117P, and transistor 124 of differential input circuit 106-1 has a gate coupled to receive a minus or negative side or rail of an input voltage 117M. Transistor 124 of differential input circuit 106-2 has a gate coupled to receive a plus or positive side or rail of an input voltage 117P, and transistor 123 of differential input circuit 106-2 has a gate coupled to receive a minus or negative side or rail of an input voltage 117M. In combination, input voltages 117P and 117M provide a differential input voltage to analog comparator 100.

At 283, a first differential input is provided to a first transconductor 131. Generally at the same time as the operation at 283, at 284, a second differential input is provided to a second transconductor 132. More particularly, a first differential input from input voltages 117P and 117M is provided to transconductor 131, and a second differential input from input voltages 117P and 117M is provided to transconductor 132. These first and second differential inputs are reversed with respect to one another as provided to differential input circuits 106-1 and 106-2 respectively of transconductors 131 and 132.

Along those lines, a drain region of transistor 123 of differential input circuit 106-1 is coupled to an output or output-side node 108-1 thereof, and a drain region of transistor 123 of differential input circuit 106-2 is coupled to an output or output-side node 108-2 thereof. A drain region of transistor 124 of differential input circuit 106-1 is coupled to input-side node 118-1, and a drain region of transistor 124 of differential input circuit 106-2 is coupled to input-side node 118-2. Source regions of transistors 123 and 124 of differential input circuit 106-1 are commonly coupled to a common interim source node 119-1, and source regions of transistors 123 and 124 of differential input circuit 106-2 are commonly coupled to a common interim source node 119-2. However, in another implementation separate interim source nodes may be used for transistors 123 and 124 of transconductors 131 and 132 for a source degeneration configuration such as to increase a linear region of operation of comparator 100.

In this example, current source circuit 105-1 and 105-2 each include a pair of current sources, which may be n-type transistor current sources. A fixed current source 125 of current source circuit 105-1 is coupled between interim node 119-1 and ground 110, and a fixed current source 125 of current source circuit 105-2 is coupled between interim node 119-2 and ground 110. An adjustable current source 103 of current source circuit 105-1 is coupled between interim node 119-1 and ground 110, and an adjustable current source 104 of current source circuit 105-2 is coupled between interim node 119-2 and ground 110. Again, in this example, bias voltage 102 is a positive voltage that may be used to adjust n-type transistors of adjustable current sources 103 and 104 in a linear region thereof for providing bias ("tail") currents 113 and 114, respectively, for converters 111 and 112. This is to adjust tail currents 113 and 114 for balanced operation of converters 111 and 112. In other words, bias currents 113 and 114 may be used to balance converters 111 and 112, and as voltage inputs 121 and 122 to amplifier 101 may be quite close to one another, bias voltage 102 may be small. For example, for an amplifier 101, an output voltage may be given by Vdd/2 plus A(Vin−Vref), where A is gain of amplifier 101 and Vin−Vref is a difference in input voltages provided to amplifier 101.

Current source circuits 105-1 and 105-2 include an adjustable current source 103 and an adjustable current source 104, respectively, coupled in parallel with a fixed current source 125 of each of current source circuits 105-1 and 105-2. Current provided by each adjustable current source 103 and fixed current source 125 and adjustable current source 104 and fixed current source 125 pair may be a total tail current for a corresponding transconductor of transconductors 131 and 132. The amount of current provided by adjustable current sources 103 and 104 depends on the size of transistors used. For example, large NMOS transistors to provide adjustable current sources 103 and 104 may deliver more bias current 113 and 114, respectively, responsive to a small bias voltage 102 than corresponding small NMOS transistors. Thus, a large NMOS transistor effectively may have a larger bias current range. Voltage on output-side node 108-1 may be varied between a supply voltage and ground responsive to variation of tail current 113, and voltage on output-side node 108-2 may be varied between a supply voltage and ground responsive to variation of tail current 114.

Converters 111 and 112 respectively include an inverter 141 and an inverter 142. Each of inverters 141 and 142 include a feedback device 145 coupled input-to-output thereof to provide a respective transimpedance amplifier load. In this example, such feedback device 145 is a resistor ("resistor 145"). However, other types of linear devices, such as for example a MOSFET operated in a linear region thereof, may be used as feedback device 145. For example, an input node 149-1 of inverter 141 is coupled to an output node 108-1 of transconductor 131, and input node 149-2 of inverter 142 is coupled to an output node 108-2 of transconductor 132. Each inverter 141 and 142 has a pair of transistors, namely a p-type transistor 143 and an n-type transistor 144.

A source region of transistor 143 in each of inverters 141 and 142 is coupled to a supply voltage bus 148, which may be the same supply voltage level as that of supply voltage bus 109. However, supply voltage buses 109 and 148 may be same or different supply voltage buses or rails (i.e., traces). Thus, inverters 141 and 142 may be used for level shifting. In each of inverters 141 and 142, gates of each pair of transistors 143 and 144 are commonly coupled to provide input nodes 149-1 and 149-2, respectively. Except for a feedback component, which in this example is a resistor 145 in inverters 141 and 142, inverters 141 and 142 may be the same (i.e., geometry/size, polarity, threshold voltage, and other transistor parameters) as inverter 220 of FIG. 1-3.

A source region of transistor 144 in each of inverters 141 and 142 is coupled to ground 110. In each of inverters 141 and 142, drain regions of each pair of transistors 143 and 144 are commonly coupled to provide output nodes 146-1 and 146-2, respectively. In inverter 141, a resistor 145 is coupled between nodes 149-1 and 146-1 to provide a transimpedance amplifier load, and in inverter 142, a resistor 145 is coupled between nodes 149-2 and 146-2 to provide another transimpedance amplifier load. In other words, inverters 141 and 142 act as respective transimpedance amplifier loads with respect to a differential input 117 as provided to transconductors 131 and 132.

Inverters 141 and 142 may be trip-point biased inverters, where coupling to output-side nodes 108-1 and 108-2, respectively, has a low impedance character due to respective feedback resistors 145 coupling input-to-output of each of such inverters. Along those lines, such feedback resistors 145 allow current to flow in either direction for a change in potential from input-to-output of inverters 141 and 142. A low-impedance state may exist when comparator 100 is balanced. Trip-point biased inverters 141 and 142 with feedback may be biased at a maximum gain and sensitivity point when input and output voltages of such inverters are equal to one another, namely balanced. Inverters 141 and 142 may further facilitate direct interface to CMOS at output voltages respectively therefrom.

An output voltage 147-1 of converter 111 may be sourced from output node 146-1 of inverter 141, and an output voltage 147-2 of converter 112 may be sourced from output node 146-2 of inverter 142. In this example, each resistor 145 is at least approximately equal to one another and each is greater than approximately 10,000 ohms ("Ω"). In this example, each resistor 145 may be in a range of approximately 40 to 70 kΩs. By having substantial resistors, manufacturing resistors within a small percentage difference of one another is enhanced. Furthermore, transimpedance amplifier loads respectively provided with inverters 141 and 142 is respectively cascaded with a transconductance respectively provided by transconductors 131 and 132. However, in another configuration, each resistor 145 may be less than 10 kΩs, such as in a range of approximately 2 kΩ to 10 kΩ.

For a low bias current 113, voltage on output-side node 108-1 may tend to drift up toward a supply voltage level, and for a high bias current 113, voltage on output-side node 108-1 may tend to drift down toward ground. Likewise, for a low bias current 114, voltage on output-side node 108-2 may tend to drift up toward a supply voltage level, and for a high bias current 114, voltage on output-side node 108-2 may tend to drift down toward ground. A total tail current provided by each adjustable current source 103 and associated fixed current source 125 and adjustable current source 104 and associated fixed current source 125 pair may thus be adjusted responsive to bias voltage 102 such that voltage on a corresponding output-side node 108-1 or 108-2 is equal to, or at least substantially equal to, reference voltage 122. If there is no differential input signal present with respect to comparator 100, then no current should flow in feedback resistors 145, and thus voltages at output-side nodes 108-1 and 108-2, as well as output voltages 147-1 and 147-2, may all be at a same voltage as reference voltage 122. Hence, comparator 100 may be balanced by driving bias currents 113 and 114 either both up or both down, and comparator 100 may be maintained in a balanced state thereafter.

Continuing the description of FIG. 2 in relation to comparator 100 of FIGS. 1-2 and 1-3, at 285, a first current 161, as generally indicated in FIG. 1-3 for this example, in relation to a first differential input at 283, is a portion of a current generated with transconductor 131. At 285, such first current 161 may be input to a first transimpedance amplifier load of inverter 141 with a resistance of a resistor 145. Such first current 161 is effectively converted to an output voltage 147-1 by a transimpedance amplifier load provided by inverter 141 with a resistor 145. Generally at the same time as the operation at 285, at 286 a second current 162, as generally indicated in FIG. 1-3 for this example, in relation to a second differential input at 284, is generated with inverter 142. Such current 162 is provided to an output-side node 108-2 of transconductor 132 to make up a difference in current. At 286, such second current 162 is input to transconductor 132.

From generating at 285, at 287 a first output voltage 147-1 of converter 111 from a first transimpedance amplifier load provided by inverter 141 with a resistor 145 may be output. Likewise, generally at the same time as generating at 285, from generating at 286, at 288 a second output voltage 147-2 of converter 112 from a second transimpedance amplifier load provided by inverter 142 with a another resistor 145 may be output. Optional operations 289 through 291 described below with additional reference to FIG. 1-2.

Because a same differential input with reversed polarities is respectively provided to converters 111 and 112, output voltages 147-1 and 147-2 move in opposite directions responsive to such differential input. Thus, output voltage 147-1 may get larger (more positive) responsive to a larger current 161 and output voltage 147-2 may get smaller (less positive) responsive to a smaller current 162, and vice versa with reference to FIG. 1-3.

Assume for purposes of clarity that input voltage 117M is 0.60V and input voltage 117P is 0.70V, then generally NMOS transistor 124 would be more conductive through its channel than an NMOS transistor 123 of equal size for transconductor 132. For a current mirror of transistors 116 and 115 of transconductor 132, this means that the amount of current flowing through transistor 124 would generally be the same amount flowing through a channel of transistor 116 and thus such amount of current would likewise be flowing through a channel of transistor 115. However, a lesser amount of current would be flowing through a channel of transistor 123 for this example. Hence, a difference between currents flowing through respective channels of transistors 115 and 123 is the current that flows to and through resistor 145 of inverter 142, namely current 162. This in effect means that output voltage 147-2 may decrease.

For the above example, with reference to transconductor 131, an opposite difference in current direction would occur. Along those lines, if input voltage 117M is 0.60V and input voltage 117P is 0.70V as before, then generally NMOS transistor 124 would be less conductive through its channel than an NMOS transistor 123 of equal size for transconductor 131. For a current mirror of transistors 116 and 115 of transconductor 131, this means that the amount of current flowing through transistor 124 would generally be the same amount flowing through a channel of transistor 116 and thus such amount of current would likewise be flowing through a channel of transistor 115. However, a greater amount of current would be flowing through a channel of transistor 123 for this example. Hence, a difference between currents flowing through respective channels of transistors 115 and 123 is the current that flows through resistor 145 of inverter 142, namely current 161. However, this current 161 is effectively sourced from a channel of inverter 141, namely from current flowing through transistor 143 of inverter 141. This means that in effect output voltage 147-1 increases to make up the difference in currents.

The above example is just one example, and of course other examples of other values of input voltages may be used. Furthermore, in such other examples, input voltage 117M may be greater or less than input voltage 117P, as may vary on a differential input 117. Accordingly, if no signal is present, namely there is no differential input 117, then current through channels of transistors 115 and 123 for each of transconductors 131 and 132 may be the same, and so output voltages 147-1 and 147-2 may thus equal reference voltage 122. If, however, there is some signal present in the form of differential input 117, then respective currents 161 and 162, representing a difference in currents at output-side node 108-1 and a difference in currents at output-side node 108-2 flow through a respective resistor 145. Even though arrows for currents 161 and 162 illustratively depict a direction of current flow for the above-described example, it should be appreciated from the above-description that such current flow is bi-directional. In other words, in an example where input voltage 117M is greater than input voltage 117P, current 161 may flow away from or out of output-side node 108-1, in which example current 162 may flow toward or into output-side node 108-2.

In brief, if there is a difference between currents flowing through channels of commonly coupled transistors 115 and 123 of transconductors 131 and 132, then such difference must go somewhere or such difference must be sourced from somewhere, which in this example is in effect a feedback voltage path through a resistor 145 of one of inverters 141 and 142 and a feed forward voltage path of a resistor 145 of the other one of inverters 141 and 142. For purposes of clarity by way of example and not limitation, as each of resistors 145 from time-to-time may provide a feedback path, such resistors 145 are generally referred to as feedback devices.

Accordingly, output voltage 147-1 is determined by a difference in current through channels of transistors 115 and 123 of transconductor 131 multiplied by a resistance of resistor 145 of inverter 141. Likewise, output voltage 147-2 is determined by a difference in current through channels of transistors 115 and 123 of transconductor 132 multiplied by a resistance of resistor 145 of inverter 142. By having a large resistance for a resistor 145, even small differences in current may result in large output voltage swings. Along those lines, transconductors 131 and 132 with adjustable tail currents for balancing provide some transconductance current at output-side nodes 108-1 and 108-2, respectively. Thus, a voltage difference input is converted to a difference current at an output-side node, such as output side nodes 108-1 and 108-2, to provide a respective transconductance, $g_m$, where a voltage gain of a converter stage is such transconductance, $g_m$, multiplied by resistance, R, of resistor 145. Because no bias current, such as from a pair of current sources 103 and 125, or from a pair of current sources 104 and 125, flows in either of resistors 145, resistor 145 may be a large resistance. This large resistance for resistor 145 means a large output voltage swing, as well as means that a change in condition on an output-side node, such as output side nodes 108-1 and 108-2, may move less. Thus, an output-side node, such as output side nodes 108-1 and 108-2, may function as virtual ground with enhanced sensitivity. In other words, if voltage gain is large, voltage at an output-side node, such as output side nodes 108-1 and 108-2, may have little movement for operation with a low delay. Output side nodes 108-1 and 108-2 in effect are current-based, not voltage-based, nodes, as such nodes are inputs to a transimpedance amplifier.

FIG. 1-3 is a schematic/block diagram depicting another exemplary comparator 100. This example of comparator 100 is further described with simultaneous reference to FIG. 1-2, where converter 111 and converter 112 are indicated as respective blocks without the details in FIG. 1-2 for purposes of clarity and not limitation. Accordingly, the above-description with reference to FIG. 1-2 regarding comparator 100 is not repeated for purposes of clarity and not limitation. Additionally, the above-description of comparator flow 200 of FIG. 2 likewise applies to comparator 100 of FIG. 1-3. Along those lines, such description of comparator flow 200 of FIG. 2 is not repeated; however, additional description of comparator flow 200 is provided with reference to optional operations 289 through 291 which may be carried out with comparator 100 of FIG. 1-3. Accordingly, comparator 100 of FIG. 1-3 is further described with simultaneous reference to FIGS. 1-2, 1-3, and 2.

In this example of comparator 100, a bias voltage 102 from output of amplifier 101 is provided to an input node 138 for input to converter 111 and converter 112, as previously described. Additionally, output voltages 147-1 and 147-2 may be provided as respective inputs to a voltage averager 210. While a separate voltage averager 210 is illustratively depicted for clarity, amplifier 101 in another configuration may be configured with a resistor ladder with control sensing so as to obtain an average of output voltages 147-1 and 147-2, where amplifier 101 may have three or more inputs to implicitly perform averaging. In this configuration, amplifier 101 is a conventional voltage amplifier, namely amplifying any voltage difference between input voltages provided on plus and minus input ports thereof to provide a voltage output. Output of voltage averager 210 is an average of output voltages 147-1 and 147-2, which is used as an input voltage 121 provided to amplifier 101.

Output voltages 147-1 and 147-2, sourced from output ports of inverters 141 and 142 respectively of converter 111 and converter 112, are respectively provided as inputs to inverters 201 and 202. Inverters 201 and 202 may be respective CMOS inverters for CMOS levels for output. In this example, inverters 201 and 202 are biased between Vdd and ground. Output of inverter 201 may be a minus side port voltage output 203, and output of inverter 202 may be a plus side port voltage output 204.

With continued reference to FIG. 2, optionally at 289 from an operation at 287, a first output voltage 147-1 may be fed back from a first transimpedance amplifier load provided with inverter 141 to a voltage averager 210. Generally at the same time as the operation at 289, optionally from an operation at 288 at 290 a second output voltage 147-2 may be fed back from a second transimpedance amplifier load provided with inverter 142 to voltage averager 210. Optionally, at 291, an input voltage 121 may be generated with voltage averager 210 as an average of such first and second output voltages 147-1 and 147-2. For example, a bias voltage 102 may be in a range of approximately 50 to 90 percent of a supply voltage level used to provide reference voltage 122. So for example, if Vdd is 1V, and reference voltage, Vref, 122 is 0.5V, then an input voltage 121, depending upon loop gain around comparator 100, may be approximately within 5 mV of Vref. Generally, for balanced input voltages, namely for input voltage 117P equal to input voltage 117M, voltages at output-side nodes 108-1 and 108-2 may be equal. If gain of amplifier 101 is sufficiently high, then output voltages 147-1 and 147-2 may be equal with both output nodes being biased to approximately equal reference voltage 122. Of course, random offsets caused by device mismatches may affect balancing of input voltages.

Along the above lines, by feeding back output voltages 147-1 and 147-2 to provide input voltage 121, a comparator 100 may be self-balancing. In other words, a reference inverter 220, a reference amplifier 101, and output voltages fed back to obtain an average thereof provides closed loop control. This means that an average of output voltages 147-1 and 147-2 may in effect be driven to be approximately equal to reference voltage 122, meaning that controllably adjustable bias currents 113 and 114 may remain at a same optimal bias condition for stable balance of comparator 100 to provide a low-tau. This average of output voltages 147-1 and 147-2 may be maintained, even when a differential input 117 is unbalanced, namely input voltage 117P does not equal input voltage 117M.

Because output voltages 147-1 and 147-2 move in opposite directions, an average of output voltages 147-1 and 147-2 may stay relatively constant even in the presence of signal, namely when a differential input is applied to comparator 100, which facilitates a low-delay of comparator 100 during operation. Generally, for a linear region of operation of comparator 100, output voltage 147-1 deviates from reference voltage 122 an equal amount to deviation of output voltage 147-2 from reference voltage 122 but with opposite sign, namely the magnitudes of each deviation are equal meaning that comparator 100 stays balanced. In other words, bias currents 113 and 114 may be stable, namely bias currents 113 and 114 once set need not change responsive to presence of a changing signal differential input 117. Thus, comparator 100 may effectively remove a substantial amount of a "memory effect" due to processing of prior differential input 117 signaling provided a linear region of operation is maintained. Generally, as long as output voltages 147-1 and 147-2 are not swung rail-to-rail, namely operating in non-linear range of operation, causing magnitude differences in such output voltages 147-1 and 147-2 to be unequal causing an adjustment of bias currents 113 and 114 to rebalance comparator 100, then a "memory effect" may be removed by having unchanged bias currents 113 and 114.

Reference voltage 122 is a voltage provided from an output of a CMOS inverter 220. CMOS inverter 220 is biased between a supply voltage bus 148 and ground 110. In this example, supply voltage bus 148 is at a Vdd voltage level; however, voltage levels other than Vdd may be used in other examples. Furthermore, each supply voltage bus 148 may be the same or different voltage buses though they are both at a same voltage level. Inverter 220 includes a PMOS transistor 221 and an NMOS transistor 222, where drain nodes of transistors 221 and 222 are coupled to one another at a common output node 223 from which reference voltage 122 is sourced.

In this example, reference voltage 122 is sourced from output node 223, where input and output nodes of inverter 220 are shorted to one another. Along those lines, gates of transistors 221 and 222 are coupled to one another and to output node 223. Lastly, a source node of transistor 221 is coupled to supply voltage bus 148, and a source node of transistor 222 is coupled to ground 110.

While another type of circuit may be used to provide a reference voltage 122 input, such as a fixed band gap or a resistor ladder reference among others, by using an inverter 220, transistors 221 and 222 may be same or similarly sized to corresponding transistors in inverters 141 and 142 in order to have same or similar trip points for inverters 141, 142, and 220. In an implementation, transistors 143 and 221 may all be matched to one another, and transistors 144 and 222 may all be matched to one another. Along those lines, duty cycle distortion may be avoided, or at least substantially reduced, by having a same trip point for inverters 141, 142, and 220. Moreover, as process, voltage, and/or temperature ("PVT") varies, such inverters 141, 142, and 220 may correspondingly vary with respect to one another so as to maintain a same trip point. Because no current may flow into a CMOS input gate in amplifier 101, reference voltage 122 provides a trip point of inverter 220. Comparator 100 may be biased at such a trip point in order to leverage high gains of inverters 141 and 142, as well as to leverage low impedances at output-side nodes 108-1 and 108-2 which are input nodes of such inverters 141 and 142, respectively.

In this example inverters 201, 202, and 220, as well as inverters 141 and 142, are all coupled between a same supply voltage level, such as Vdd, and a ground. While both transconductors 131 and 132 are biased between a same supply voltage level and a ground, transconductors 131 and 132 may or may not be at the same supply voltage level as inverters 141, 142, 201, 202, and 220. In this example, transconductors 131 and 132, as well as inverters 141, 142, 201, 202, and 220, are all biased to a same voltage supply level. However, in another configuration, transconductors 131 and 132, though biased to a same voltage supply level as between them, may be biased to a different supply voltage level with respect to inverters 141, 142, 201, 202, and 220. Generally, for this example, difference between input voltages to amplifier 101 may be small.

Because one or more of the examples described herein may be implemented in an FPGA, a detailed description of such an IC is provided. However, it should be understood that other types of ICs, including without limitations ASICs or block functions commensurate with high-speed operation, may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 3 illustrates an FPGA architecture 300 that includes a large number of different programmable tiles including multi-gigabit transceivers ("MGTs") 301, configurable logic blocks ("CLBs") 302, random access memory blocks ("BRAMs") 303, input/output blocks ("IOBs") 304, configuration and clocking logic ("CONFIG/CLOCKS") 305, digital signal processing blocks ("DSPs") 306, specialized input/output blocks ("I/O") 307 (e.g., configuration ports and clock ports), and other programmable logic 308 such as digital clock managers, analog-to-digital converters, system monitoring logic, and so forth. Some FPGAs also include dedicated processor blocks ("PROC") 310.

In some FPGAs, each programmable tile includes a programmable interconnect element ("INT") 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 can include a configurable logic element ("CLE") 312 that can be programmed to implement user logic plus a single programmable interconnect element ("INT") 311. A BRAM 303 can include a BRAM logic element ("BRL") 313 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 306 can include a DSP logic element ("DSPL") 314 in addition to an appropriate number of programmable interconnect elements. An 10B 304 can include, for example, two instances of an input/output logic element ("IOL") 315 in addition to one instance of the programmable interconnect element 311. As will be clear to those of skill in the art, the actual I/O pads connected, for example, to the I/O logic element 315 typically are not confined to the area of the input/output logic element 315.

In the pictured embodiment, a horizontal area near the center of the die (shown in FIG. 3) is used for configuration, clock, and other control logic. Vertical columns 309 extending from this horizontal area or column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, processor block 310 spans several columns of CLBs and BRAMs.

Note that FIG. 3 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
   an amplifier coupled to receive an input voltage and a reference voltage to provide a bias voltage;
   a first converter and a second converter coupled to the amplifier to receive the bias voltage;
   wherein the first converter comprises:
      a first transconductor coupled to the amplifier to receive the bias voltage to adjust a first bias current and to receive a first differential input; and
      a first inverter having a first feedback device coupled input-to-output of the first inverter to provide a first transimpedance amplifier load;
      wherein the first inverter is coupled to the first transconductor; and
   wherein the second converter comprises:
      a second transconductor coupled to the amplifier to receive the bias voltage to adjust a second bias current and to receive a second differential input;
      wherein the second differential input is the first differential input with a reversed polarity; and
      a second inverter having a second feedback device coupled input-to-output of the second inverter to provide a second transimpedance amplifier load;
      wherein the second inverter is coupled to the second transconductor.

2. The apparatus according to claim 1, wherein the first feedback device and the second feedback device respectively comprise a first resistor and a second resistor.

3. The apparatus according to claim 2, wherein the first resistor and the second resistor are at least approximately equal to one another and each is greater than approximately 10,000 ohms.

4. The apparatus according to claim 1, wherein the first feedback device and the second feedback device respectively comprise a first transistor and a second transistor, each of which is operated in a linear region thereof.

5. The apparatus according to claim 1, further comprising a third inverter and a fourth inverter respectively coupled to a first output port of the first inverter and a second output port of the second inverter.

6. The apparatus according to claim 1, wherein:
   the first transconductor and the second transconductor are biased between a first supply voltage and a ground;
   the first inverter and the second inverter are biased between a second supply voltage and the ground; and
   the first supply voltage and the second supply voltage are at different voltage levels.

7. The apparatus according to claim 1, wherein:
   the first transconductor and the second transconductor are biased between a first supply voltage and a ground;
   the first inverter and the second inverter are biased between a second supply voltage and the ground; and
   the first supply voltage and the second supply voltage are at the same voltage level.

8. The apparatus according to claim 1, further comprising:
   a third inverter coupled input-to-output to provide the reference voltage;
   the first inverter, the second inverter, and the third inverter are each configured to have a same trip point;
   wherein the first transconductor and the second transconductor are biased between a first supply voltage and a ground; and
   wherein the first inverter, the second inverter, and the third inverter are biased between a second supply voltage and the ground.

9. An asynchronous analog comparator, comprising:
   an amplifier coupled to receive an input voltage and a reference voltage to provide a bias voltage;
   a first converter and a second converter commonly coupled to an output port of the amplifier to receive the bias voltage;
   wherein the first converter comprises a first transconductor and a first inverter;
   wherein the first transconductor comprises:
      a first current source circuit coupled to receive the bias voltage;
      a first differential input circuit coupled to the first current source circuit; and
      a first current mirror circuit coupled to the first differential input circuit;
      wherein the first differential input circuit of the first transconductor has a first output node;
   wherein the first inverter has a first feedback device coupled in first series input-to-output of the first inverter to provide a first transimpedance amplifier load;
   wherein a first input node of the first inverter is coupled to the first output node of the first transconductor;
   wherein the second converter comprises a second transconductor and a second inverter;
   wherein the second transconductor comprises:
      a second current source circuit coupled to receive the bias voltage;
      a second differential input circuit coupled to the second current source circuit;
      a second current mirror circuit coupled to the second differential input circuit;
      wherein the second differential input circuit is the first differential input circuit with a reversed polarity differential input; and
      wherein the second differential input circuit of the second transconductor has a second output node;
   wherein the second inverter has a second feedback device coupled in second series input-to-output of the second inverter to provide a second transimpedance amplifier load; and
   wherein a second input node of the second inverter is coupled to the second output node of the second transconductor.

10. The asynchronous analog comparator according to claim 9, wherein:
    the first converter and the second converter are respective voltage-to-current-to-voltage converters; and
    the first feedback device and the second feedback device respectively comprise a first resistor and a second resistor.

11. The asynchronous analog comparator according to claim 9, further comprising a third inverter and a fourth inverter respectively coupled to a first output port of the first inverter and a second output port of the second inverter.

12. The asynchronous analog comparator according to claim 9, wherein:
the first differential input circuit is coupled to the first current source circuit at first separate interim source nodes for a source degeneration configuration; and
the second differential input circuit is coupled to the second current source circuit at second separate interim source nodes for the source degeneration configuration.

13. The asynchronous analog comparator according to claim 9, further comprising a third inverter coupled input-to-output to provide the reference voltage, wherein:
the first transconductor and the second transconductor are biased between a first supply voltage and a ground; and
the first inverter, the second inverter, and the third inverter are biased between a second supply voltage and the ground.

14. The asynchronous analog comparator according to claim 9, wherein:
the first transconductor and the second transconductor are biased between a first supply voltage and a ground;
the first inverter and the second inverter are biased between a second supply voltage and the ground; and
the first supply voltage and the second supply voltage are at different voltage levels.

15. The asynchronous analog comparator according to claim 9, wherein:
the first transconductor and the second transconductor are biased between a first supply voltage and a ground;
the first inverter and the second inverter are biased between a second supply voltage and the ground; and
the first supply voltage and the second supply voltage are at a same voltage level.

16. The asynchronous analog comparator according to claim 9, wherein the first current source circuit and the second current source circuit each respectively include an adjustable current source and a fixed current source coupled in parallel.

17. A method, comprising:
amplifying a difference between an input voltage and a reference voltage to provide a bias voltage;
biasing a first transconductor and a second transconductor with the bias voltage;
inputting a first differential input to the first transconductor;
inputting a second differential input to the second transconductor;
wherein the first differential input is the second differential input with opposite polarity;
generating a first current in relation to the first differential input with the first transconductor for input of a portion of the first current to a first transimpedance amplifier load;
generating a second current in relation to the second differential input with a second transimpedance amplifier load for input to the second transconductor;
outputting a first output voltage from the first transimpedance amplifier load; and
outputting a second output voltage from the second transimpedance amplifier load.

18. The method according to claim 17, wherein:
the first transimpedance amplifier load and the second transimpedance amplifier load are respectively provided with a first inverter and a second inverter; and
each of the first inverter and the second inverter includes a respective resistor for coupling an input node to an output node of each of the first inverter and the second inverter.

19. The method according to claim 18, further comprising:
feeding back the first output voltage from the first transimpedance amplifier load to a voltage averager;
feeding back the second output voltage from the second transimpedance amplifier load to the voltage averager; and
generating the input voltage with voltage averager as an average of the first output voltage and the second output voltage.

20. The method according to claim 18, further comprising:
biasing the first inverter and the second inverter with a first supply voltage;
biasing the first transconductor and the second transconductor with a second supply voltage different from the first supply voltage; and
level-shifting from the second supply voltage to the first supply voltage using the first inverter and the second inverter.

* * * * *